United States Patent
Wang et al.

(10) Patent No.: US 7,591,433 B2
(45) Date of Patent: Sep. 22, 2009

(54) METHOD FOR CONTROLLING FAN SPEED

(75) Inventors: Hsuan Cheng Wang, Taipei (TW);
Chun-Hung Lin, Taipei (TW);
Chi-Hsin Lin, Taipei (TW)

(73) Assignee: Compal Electronics, Inc., Taipei ( * ) Notice: Subject to any disclaimer, the term of this patent is extended or adjusted under 35 U.S.C. 154(b) by 723 days.

(21) Appl. No.: 11/161,132

(22) Filed: Jul. 25, 2005

(65) Prior Publication Data

US 2006/0054713 A1 Mar. 16, 2006

(30) Foreign Application Priority Data

Sep. 10, 2004 (TW) .............................. 93127420 A

(51) Int. Cl.
*F24F 7/00* (2006.01)
*H05K 7/20* (2006.01)

(52) U.S. Cl. ...................... 236/49.3; 62/186; 62/259.2; 361/695

(58) Field of Classification Search ................ 236/49.3; 62/186, 259.2; 361/695
See application file for complete search history.

(56) References Cited

U.S. PATENT DOCUMENTS

| 4,672,228 | A  | * | 6/1987  | Swoboda .................... 307/66    |
| 6,239,971 | B1 | * | 5/2001  | Yu et al. ..................... 361/695 |
| 6,336,080 | B1 | * | 1/2002  | Atkinson .................... 702/132  |
| 6,400,045 | B1 | * | 6/2002  | Hosokawa et al. .......... 307/117    |
| 6,928,565 | B2 | * | 8/2005  | Watts et al. ................. 713/322 |
| 2002/0020755 | A1 | * | 2/2002 | Matsushita ................. 236/49.3  |
| 2003/0030977 | A1 | * | 2/2003 | Garnett et al. .............. 361/687  |
| 2006/0054713 | A1 | * | 3/2006 | Wang et al. ................ 236/49.3 |

* cited by examiner

*Primary Examiner*—Marc E Norman
(74) *Attorney, Agent, or Firm*—Jianq Chyun IP Office

(57) ABSTRACT

A method for controlling the fan speed by detecting different power supplies of a mobile electronic device is proposed. When an external power source is used for mobile electronic device and detected by the embedded controller, the first fan control table is used to control the fan speed to increase the heat dissipation capability of the mobile electronic device. When battery power is used as the power source and detected by the embedded controller, a second fan control table is used to control the fan speed to extend the battery life. The first fan control table and the second fan control table become the relation control table between the temperature of the processor and the fan speed or the relation fan control table between the temperature of the processor and the input voltage of the fan for controlling the fan speed according to the temperature of the processor.

10 Claims, 3 Drawing Sheets

METHOD FOR CONTROLLING FAN SPEED

CROSS-REFERENCE TO RELATED APPLICATION

This application claims the priority benefit of Taiwan application serial no. 93127420, filed on Sep. 10, 2004. All disclosure of the Taiwan application is incorporated herein by reference.

BACKGROUND OF THE INVENTION

1. Field of the Invention

The present invention relates to a control method for controlling fan speed for the thermal fan unit. In particular, it is relating to a fan speed control method, under several power supplies for mobile electronic devices, capable of improving the heat dissipation capability for a mobile electronic device or extending battery life at the same time.

2. Description of the Related Art

Because of recent trends in electronic device miniaturization, electronic device functionality has become more advanced, the internal temperature of electronic device has become higher and higher. In addition, the trend is towards higher power consumption; therefore, ability to obtaining an improved thermal management environment and, at the same time, capability for extending battery life are important objectives for mobile electronic devices.

In mobile electronic devices, a fan is typically the primary element which is relied upon for providing the primary thermal management function, releasing of thermal energy from the inside of mobile electronic devices or suction for outside cooler air to enter inside, and preventing device internal elements from overheating, which leads to excessive thermal and performance degradations. Mobile electronic devices include notebook computer and desktop computer. Conventional method for fan control is done using a fan control table and fan speed for controlling the internal temperature of the mobile device. One of the temperatures chosen for temperature control is the processor temperature. Because the processor is a component that releases the most thermal energy in the device and because of excessive temperature leading to degradation of components, the fan is used to provide the thermal management function for the processor.

To prevent excessive acoustic noise from extended running of the fan at excessive speeds, the fan typically adjusts its fan speed, raising or lowering the speed corresponding to the processor temperature for providing adequate thermal management capability and for preventing excessive acoustic noise causing user discomfort. However, by using only the fan control table derived from the processor temperature and the fan speed for fan control, it leads to severe battery drain while the mobile electronic device is operating in battery mode because of the added power consumption requirements directly relating to unnecessary heat dissipation. While the mobile electronic device is using its battery mode for power source, the processor frequency is automatically lowered to prevent excessive thermal buildup. At this time, the continuing use of the fan control table obtained from corresponding fan speed with respect to the original processor temperature leads to excessive heat dissipation and reduction in power availability, which leads to an increase of acoustic noise given off by the fan.

Referring to FIG. 1, it is a schematic diagram for a conventional fan speed control technology, taken from Taiwan Patent Application No. 093124620 entitled "Automatic Fan Micro-Adjustment Method", filed Aug. 17, 2004, owned by the same assignee. The conventional technology is using a fan control table, derived from the fan speed relation with respect to a single temperature reading, to stabilize the fan's thermal management system and to manage the accompanying acoustic noise. As soon as the processor temperature is raised, while the fan speed is below the fan control table's indicated benchmark value, the fan speed gradually increases to raise the processor's heat dissipation capability and to prevent excessive acoustic noise (step 620). As soon as the processor temperature is lowered just as the fan speed is above the fan control table's indicated benchmark value, the fan speed gradually decreases to reduce power consumption (step 626). Using conventional technology to control fan speed can only achieve limited power consumption savings, for it is only using the fan control table obtained from only one temperature reading with respect to fan speed and it is suffering from excessive drain on the battery power.

SUMMARY OF THE INVENTION

In consideration of improving the conventional fan speed control method in areas of mobility, battery life, and acoustic noise level, the present invention provides a plurality of fan speed control methods using a plurality of power supplies for mobile electronic device. According to the actual power source condition used by a mobile electronic device, the invention can switch between a plurality of fan control tables, which are derived from the relations of operating temperatures and fan speed, to control the fan speed to prolong battery life for mobile electronic devices during battery operation mode.

Another objective of the invention is the modification of the fan control table, which is obtained from the relationship between the application temperature with respect to the fan speed, for controlling the fan speed based upon the power source status for mobile electronic devices, and for extending the lifespan of the fan.

Another objective for the invention is the reduction of the acoustic noise generated by the fan, based upon the mobile electronic device's power source operating condition, by modifying the fan control table, which is derived from the relationship of the application temperature with fan speed, for controlling the fan speed.

According to the aforementioned objectives, the present invention provides a fan speed control method for use under a plurality of power source conditions for mobile electronic devices. First, the embedded controller (EC) is used to detect the current power source status for the mobile electronic device. Upon detection by the EC of external-connection power source, the EC adopts a first fan control table to control the fan speed to improve the thermal management capability for the mobile electronic device. Upon detection by the EC of battery-powered power source, the EC adopts a second fan control table to control the fan speed for extending battery life. The first fan control table and the second fan control table can become corresponding speed lookup tables for both the processor temperature and the fan speed or become relation lookup tables for both the processor temperature and fan input voltage based upon the processor temperature or the internal temperature of electronic device to control the fan speed. The heat dissipation capability of the first fan control table for controlling the fan speed is higher than that of the second fan control table. The first fan control table and the second fan control table can be stored within one memory device. One such memory device can be a memory unit comprising EC, flash memory, or Read-Only Memory (ROM). The present invention can be used to extend the battery life of battery power source for the mobile electronic device, to extend the processor fan lifespan, and to reduce the acoustic noise of the fan during operation.

BRIEF DESCRIPTION OF THE DRAWINGS

The accompanying drawings, which are incorporated herein and form a part of the specification, illustrate the present invention, and together with the description, further server to explain the principles of the invention and to enable a person skilled in the pertinent art to make and use the invention.

DESCRIPTION OF THE EMBODIMENTS

Figure 1:
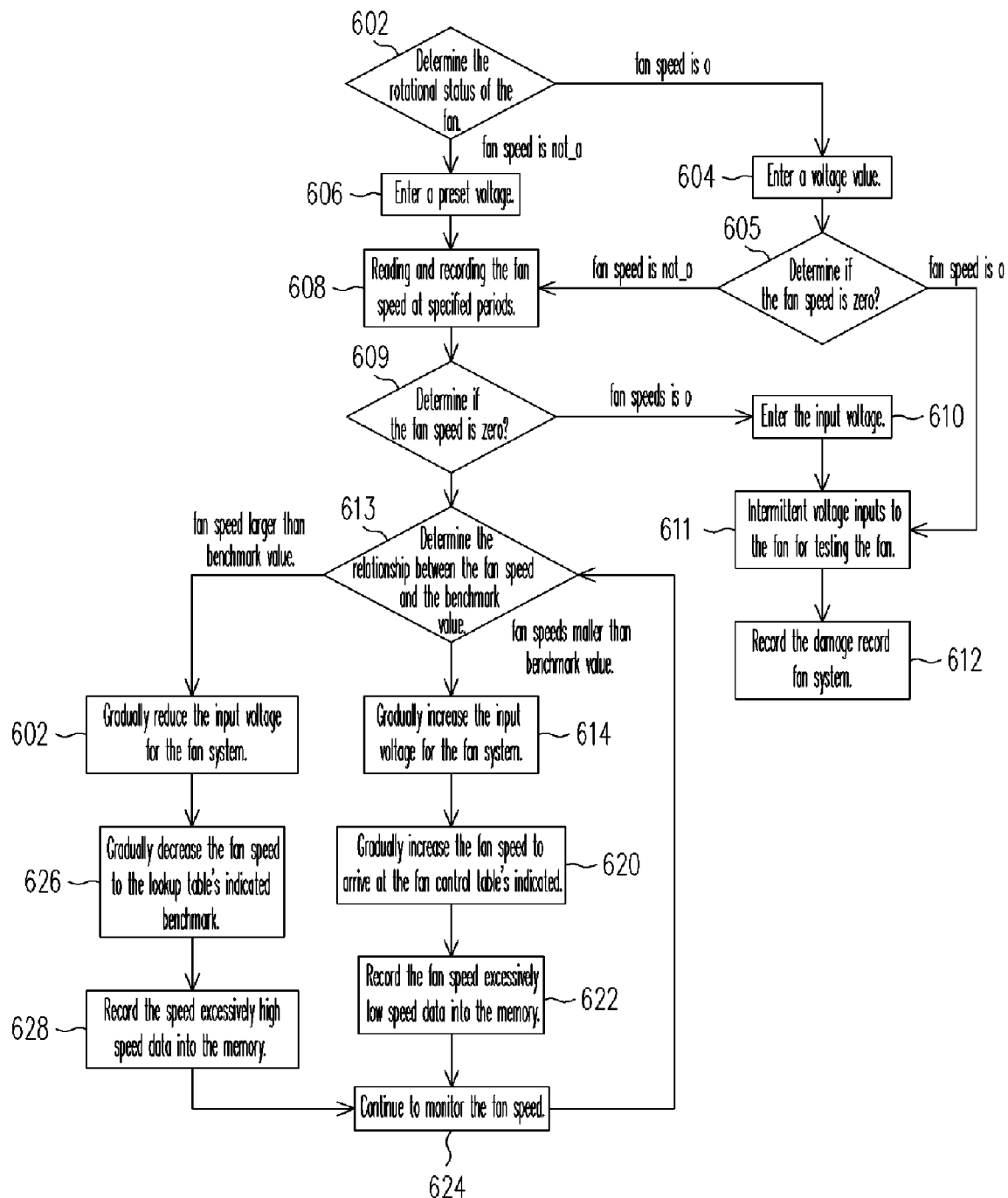
FIG. 1 is a flowchart diagram illustrating a conventional fan speed control system.
Figure 2:
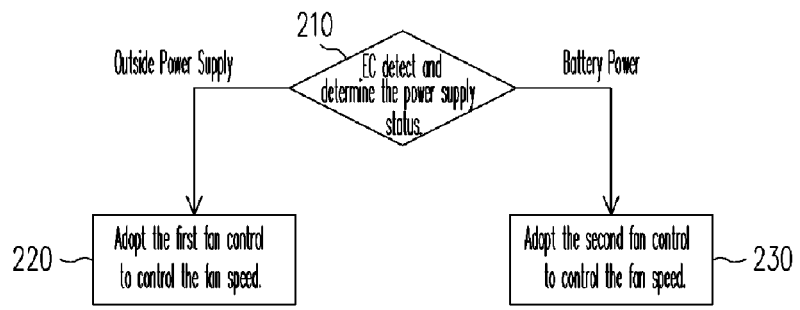
FIG. 2 is a flowchart diagram illustrating a fan speed control system according to an embodiment of the present invention.

Referring to FIG. 2, it is a flowchart illustrating the control method according to an embodiment of the present invention. The first step is using the EC to detect and to determine the power source for mobile electronic devices (step 210). As soon as a determination is made that the power source is an external-connection power source, the EC adopts the first fan control table by following along the processor temperature's high and low fluctuations to control the fan speed (step 220) to arrive at the required thermal management efficiency level for the mobile electronic device. On the other hand, if the EC determines that the power source is a battery power, the EC adopts the second fan control table (step 230) by following along the processor temperature high and low fluctuations to control the fan speed. The first fan control table and the second fan control table can become the corresponding speed lookup table for both the processor temperature and the fan speed or become the relation lookup table for both the processor temperature and fan input voltage based upon the processor temperature or the internal temperature of electronic device to control the fan speed. As the processor temperature is raised or lowered, the fan speed also compensates accordingly to provide an adequate thermal management capability. Since typically the processor is the largest heat generating source within a mobile electronic device; therefore, the fan speed often has to adjust corresponding to the processor temperature to achieve proper thermal management. But because of the differences in product requirements, the processor temperature can also change corresponding to the internal temperature of the mobile device. The first fan control table and the second fan control table memory storage locations typically comprise of EC, flash memory, or ROM.

The differences between the first fan control table and the second fan control table are in the timing differences during fan start up or in the differences for the corresponding fan speed under the same temperature. Under the identical temperature condition, the heat dissipation capability using the first fan control table is higher than that using the second fan control table. Typically when an electronic device is using external-connection power source, under an assumed condition of adequate power, the processor appropriately raises its operating frequency and increase data processing efficiency for the device. As the processor's power consumption rate is increased, its temperature also rapidly increases accordingly, thus needing the higher heat dissipation capability of the first fan control table, for preventing mobile devices from damages due to overheating. When the mobile electronic device is running in battery mode, for the sake of conserving battery power, the processor inside the mobile electronic device typically lowers its operating frequency for optimizing battery power consumption. As a result of the reduction in power consumption rate, the processor operating temperature does not increase rapidly, and can therefore adopt the second fan control table, which has a lower heat dissipation capability, for controlling the fan speed and using the fan start up timing delay to extend the battery life.

Figure 3A:
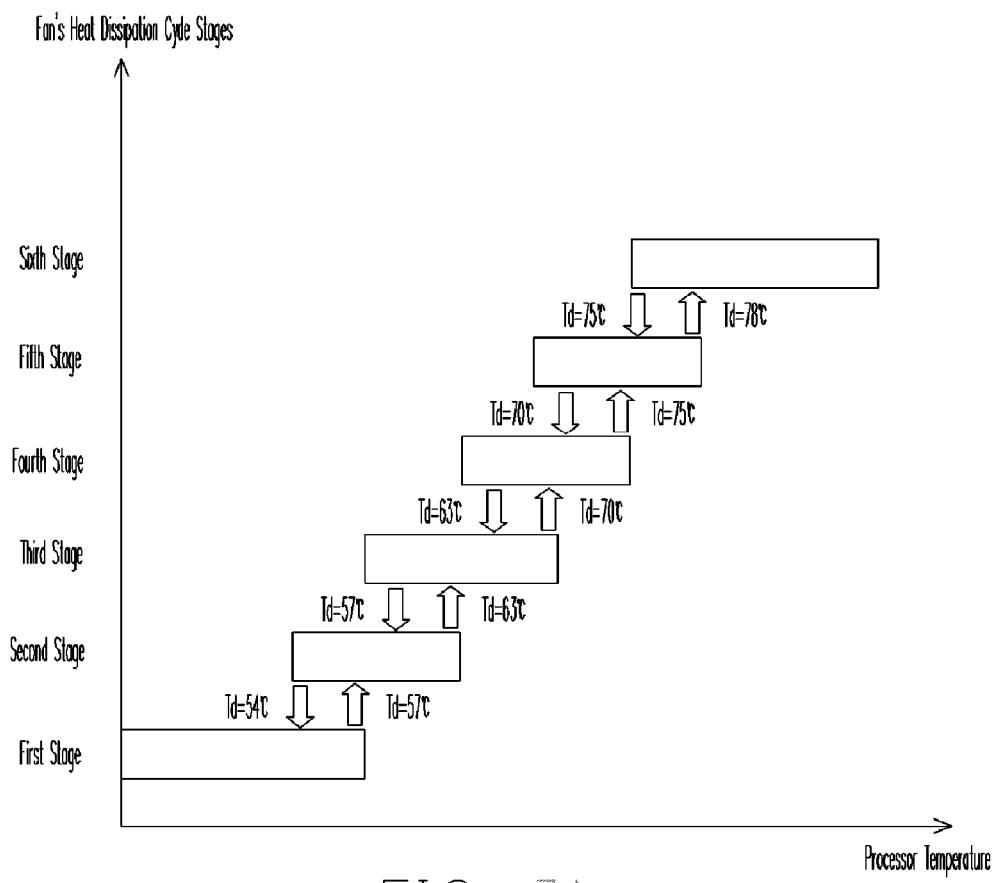
FIG. 3A is a diagram illustrating the corresponding ranges of the first fan control table during power usage under outside power according to an embodiment of the present invention.
Figure 3B:
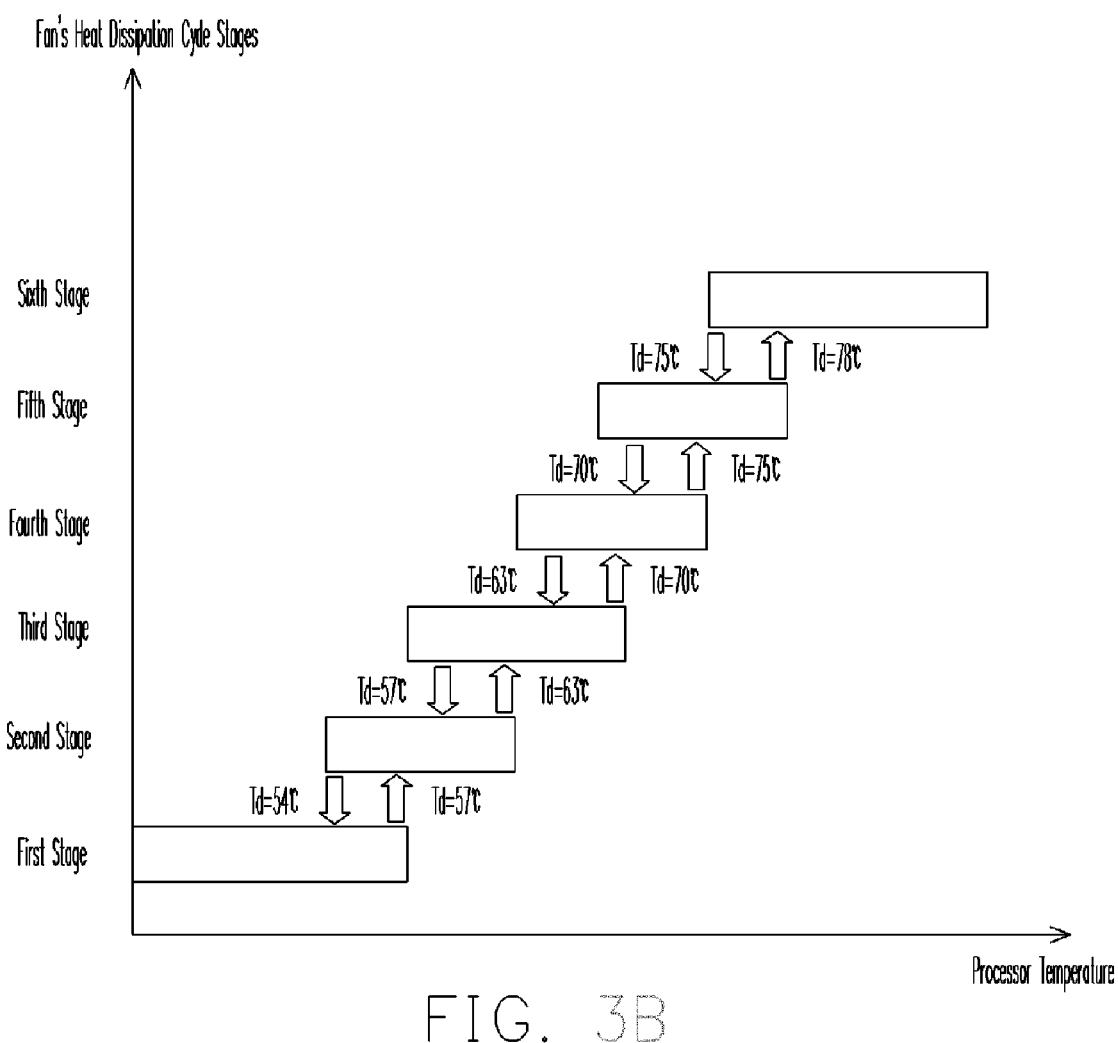
FIG. 3B is a diagram illustrating the corresponding ranges of the second fan control table during power usage under battery power according to an embodiment of the present invention.

Both the functional capabilities for currently available mobile electronic devices and their corresponding thermal energy generated are progressively increasing, therefore, a plurality of fans are usually found inside mobile electronic devices to provide adequate thermal management capability. An embodiment of the present invention below relates to a mobile electronic device using a fan system with two fan control tables designed for a plurality of power source conditions. However, this is not limited to within only the scope of the present invention, one of the fan systems comprises a first fan and a second fan. Refer to FIG. 3A, it is an embodiment of the present invention using outside power source as the power source. Referring to FIG. 3B, it is a flowchart illustrating the utilization of the second fan control table using battery power as the power source according to an embodiment of the invention.

First, the EC is used to determine and detect the power source for mobile electronic device; upon determination of the power source, the EC adopts the first fan control table by following along the processor temperature fluctuations to control the fan speed of the fan to arrive at the required heat dissipation efficiency level for mobile electronic devices during running conditions. Using the first fan control table and the second fan control table, the EC is controlling the input voltage for the fan corresponding to the detected processor temperature, and further proceeding to control the speed of the fan. In one embodiment of the present invention, the input voltage of the fan switches to six levels corresponding to the detected processor temperature, and further proceeding to control the speed of the fan. When the processor temperature is equal or below 57° C., the fan system starts the first fan to initiate the first heat dissipation step. The first fan has input voltage of 3 V. When the processor temperature is above 57° C., the fan system starts the second fan, while maintaining the first fan speed, to enter into the second heat dissipation step. The first fan and the second fan input voltages are now both 3V. When the processor temperature is above 63° C., the fan system simultaneously raises the input voltages for both the first fan and the second fan to increase the speeds of both the first fan and the second fan, and proceeding into the third stage of heat dissipation step for the fan system. The input voltages of the first fan and the second fan are both 3.5 V. When the processor temperature is above 70° C., the fan system simultaneously raises the input voltages for the first fan and the second fan to increase both speeds of the first fan and the second fan, and proceeding into the fourth stage of heat dissipation step for the fan system. The input voltages of the first fan and the second fan are each 4 V. When the processor temperature is above 75° C., the fan system increases the input voltage for the first fan, while maintaining the second fan speed using the heat dissipation capability of the thermal management system to proceed into the fifth stage of heat dissipation step for the fan system. The first fan input voltage is 5 V; and the second fan input voltage is 4 V. When the processor temperature is above 78° C., the fan system raises the input voltage of the second fan, while maintaining the fan speed of the first fan, to increase the heat dissipation capability and proceeding into the sixth stage of heat dissipation step for the fan system. The input voltages for the first fan and the second fan are both 5 V. When the processor temperature is above 82° C. and because the processor is already reaching critical temperature of be damaged; therefore, the operating system (OS) automatically shuts down to protect the processor from damage. At this time, the first fan and the second fan maintains the fan speed of the sixth stage.

When the power source is determined to come from battery power, the EC adopts the second fan control table, in accordance with the processor temperature level, to control the speed of the fan and to arrive at the thermal management efficiency requirement for electronic device operations. When the processor temperature is at 57° C. or below, the fan starts the first fan to maintain the first heat dissipation stage of the heat dissipation cycle. The input voltage of the first fan is 3 V while the second fan remaining idle. Upon the processor temperature reaching above 63° C., the fan system enters the second stage of the heat dissipation cycle. The speed of the first fan remains the same as in the prior step while the second fan remaining idle. The input voltage for the first fan is 3 V. As soon as the processor temperature reaching above 63° C., the fan system increases the input voltage for the first fan and thus increases its corresponding speed, and entering into the third stage of the heat dissipation cycle. The input voltage of the first fan is 3.5 V and the second fan is still idle. As soon as the processor temperature is reaching above 70° C., the fan system increases the input voltage of the first fan, and also increases the speed of the first fan, and enters into the fourth stage of the heat dissipation cycle. The input voltage of the first fan is 4 V and the second fan still remaining idle. As soon as the processor temperature reaching above 75° C., the fan system now starts the second fan while increasing the speed of the first fan for increasing the heat dissipation capability for the fan system, and entering the fifth stage of the heat dissipation cycle. The input voltage of the first fan is 5 V and the input voltage for the second fan is 3 V. As soon as the processor temperature reaching above 78° C., the fan system increases the input voltage for the second fan while maintaining the speed of the first fan to increase the heat dissipation capability for the fan system, and entering the sixth stage of the heat dissipation cycle. The input voltages of the first fan and the second fan are both at 5 V. As soon as the processor temperature reaching above 82° C. nearing the imminent damage critical temperature, the operating system (OS) automatically shuts down to protect the processor from potential damage. At the seventh stage of the heat dissipation cycle, the first fan and the second fan, while maintaining the fan speed of the sixth stage, attempt to provide optimal heat dissipation capability.

In an embodiment of the present invention, the biggest difference between the first fan control table and the second fan control table is a start-up timing of the second fan. While the mobile electronic device is using external-connection power as the power source and the first fan control table, because of no restriction on the power source, the processor is able to take advantage of its greatest efficiency. At this particular time the thermal energy is larger than during battery operation; therefore, leading to a greater demand on improved heat dissipation capability for the fan system to prevent the processor from damage. The second fan during the second stage of the heat dissipation cycle is started for providing an improved heat dissipation capability. While the mobile electronic device is using battery power as its power source, due to the limitation of the power source quantity, the processor is typically reducing its operating efficiency to conserve power. At this time, the thermal energy generated is lower than that during outside power source, and leading to an appropriate amount of heat dissipation capability for the fan system, thus preventing the processor from damaging. The second fan only during the fifth stage of the heat dissipation cycle is started to provide an appropriate heat dissipation capability while at the same time extending battery life. Because of the tremendous decrease of usage rate for the fan during the using of the second fan control table for the second fan, the methods in the present invention serves to lower the acoustic noise during fan operations, and thus extends the fan lifespan. In the current embodiment, although the biggest difference between the first fan control table and the second fan control table lies at the timing lag of the start up condition for the second fan control table with respect to the start condition for the first fan control table, this does not limit the scope for the current invention. When the processor temperature is the same, the corresponding fan speed for the second fan control table is lower than the corresponding fan speed for the first fan control table to extend battery life.

In summary, comparing the first fan control table and the second fan control table, there are at least two differences in between. The first difference between the first fan control table and the second fan control table lies in that a temperature for one of the fans (second fan) starting up in the first fan control table is lower than a temperature for one of the fans starting up in the second fan control table. The second difference between the first fan control table and the second fan control table lies in that a second fan speed in the first fan control table is higher than the second fan speed in the second fan control table.

In summary, the invention provides a method under a plurality of power supplies for mobile electronic devices for controlling the fan speed. First, the embedded controller (EC) is used to investigate the current conditions of the power source for the mobile electronic device. Upon the detection by the embedded controller of using external-connection power source by the mobile electronic device, the embedded controller adopts a first fan control table to control the fan speed to improve the heat dissipation ability for the mobile electronic device. When the battery power is used as the power source for the mobile electronic device and is detected by the EC, the second fan control table is used to control the fan speed for extending the battery life. The first fan control table and the second fan control table can become as a corresponding speed fan control table for the temperature of the processor and the fan speed or become as a relation fan control table for the temperature of the processor and the input voltage of the fan to control the fan speed corresponding to the temperature of the processor or the mobile device internal temperature. The heat dissipation capability from the first fan control table for controlling the fan speed is higher than that of the second fan control table. The first fan control table and the second fan control table can be stored on a memory chip, the memory chip comprises of an EC, a flash memory, or a Read-Only Memory (ROM). The methods of the present invention can be used for extending battery life for mobile electronic devices and for extending the fan lifespan. The methods of the present invention can also reduce the acoustic noise given by the fan during operation.

Although an embodiment of the present invention is shown, it will be apparent to those skilled in the art that various modifications and variations can be made to the structure of the present invention without departing from the scope or spirit of the invention. In view of the foregoing, it is intended that the present invention cover modifications and variations of the present invention provided they fall within the scope of the following claims and their equivalents.

What is claimed is:

1. A method of controlling a fan speed of a fan system for a mobile electronic device, comprising:
   an embedded controller (EC) to detect and determine a power source of the mobile electronic device;
   wherein when the power source is an external-connection power source, a first fan control table is used to control the fan system, and the fan system comprises a plurality of fans;
   wherein when the power source is a battery power, a second fan control table is used to control the fan system, and when the first fan control table is used to control the fan system, a start time for one of the fans in the first fan control table is prior to a start time used by the second fan control table to control the fan system.

2. The method according to claim 1, wherein the first fan control table and the second fan control table are stored inside a memory.

3. The method according to claim 2, wherein the memory is a flash memory or an internal memory of the EC.

4. The method according to claim 1, wherein the mobile electronic device includes a processor.

5. The method according to claim 4, wherein the first fan control table and the second fan control table are corresponding speed fan control tables between a temperature of the processor and a fan speed for the fan system.

6. The method according to claim 4, wherein the first fan control table and the second fan control table are relation fan control tables between a temperature of the processor and a fan input voltage for the fan system.

7. The method according to claim 4, wherein a power consumption under using the first fan control table to adjust the fan system is higher than a power consumption under using the second fan control table to adjust the fan system.

8. The method according to claim 1, wherein the first fan control table and the second fan control table are corresponding speed fan control tables between an internal temperature of the electronic device and the fan speed for the fan system.

9. The method according to claim 1, wherein the first fan control table and the second fan control table are relation fan control tables between a internal temperature of the electronic device and a fan input voltage for the fan system.

10. The method according to claim 1, wherein a heat dissipation capability under using the first fan control table to control the fan system is higher than a heat dissipation capability under using the second fan control table to control the fan system.

* * * * *